United States Patent
Kim et al.

(10) Patent No.: US 12,327,582 B2
(45) Date of Patent: Jun. 10, 2025

(54) MEMORY DEVICE AND OPERATING METHOD WITH MECHANISM TO DETERMINE VICTIM ROWS FOR REFRESHING

(71) Applicant: SAMSUNG ELECTRONICS CO., LTD., Suwon-si (KR)

(72) Inventors: Hijung Kim, Suwon-si (KR); Seong-Jin Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 55 days.

(21) Appl. No.: 18/232,940

(22) Filed: Aug. 11, 2023

(65) Prior Publication Data

US 2024/0185904 A1 Jun. 6, 2024

(30) Foreign Application Priority Data

Dec. 6, 2022 (KR) ........................ 10-2022-0168666

(51) Int. Cl.
*G11C 11/406* (2006.01)
(52) U.S. Cl.
CPC .... *G11C 11/406* (2013.01); *G11C 2211/4062* (2013.01)
(58) Field of Classification Search
CPC ............ G11C 11/406; G11C 11/40603; G11C 11/408; G11C 2211/4062; G11C 29/42; G06F 3/0658
See application file for complete search history.

(56) References Cited

U.S. PATENT DOCUMENTS

| | | | |
|---|---|---|---|
| 9,032,141 B2 | 5/2015 | Bains et al. | |
| 9,251,885 B2 | 2/2016 | Greenfield et al. | |
| 9,685,218 B2 | 6/2017 | Sohn et al. | |
| 10,032,503 B2 | 7/2018 | Kang et al. | |
| 10,497,422 B2 | 12/2019 | Lee et al. | |
| 10,832,792 B1 | 11/2020 | Penney et al. | |
| 10,860,222 B2 | 12/2020 | Shin et al. | |
| 2014/0189228 A1 | 7/2014 | Greenfield et al. | |
| 2018/0342283 A1 | 11/2018 | Lee et al. | |
| 2019/0221273 A1* | 7/2019 | Parkinson | G06F 12/0246 |
| 2019/0347019 A1 | 11/2019 | Shin et al. | |
| 2022/0415384 A1* | 12/2022 | SeyedzadehDelcheh | G11C 11/40603 |

FOREIGN PATENT DOCUMENTS

KR 10-2308778 B1 10/2021
KR 10-2358563 B1 2/2022

* cited by examiner

Primary Examiner — Sultana Begum
(74) Attorney, Agent, or Firm — Muir Patent Law, PLLC

(57) ABSTRACT

A memory device includes a memory cell array including a plurality of rows, an ECC engine configured to determine a health level for each of the plurality of rows based on the number of corrections of errors of data read from each of the plurality of rows, a control logic configured to determine a victim row address based on the health level and the number of accesses for each of the plurality of rows, and a refresh control circuit configured to perform a refresh on a row corresponding to the determined victim row address.

13 Claims, 11 Drawing Sheets

FIG. 5

| ROW ADDRESS | ACCESS COUNT | HEALTH LEVEL |
|---|---|---|
| R1 | 0 | LEVEL 1 |
| R2 | 2000 | LEVEL 1 |
| R3 (weak) | 3000 | LEVEL 2 |
| R4 | 2000 | LEVEL 1 |
| R5 | 0 | LEVEL 1 |
| R6 | 2000 | LEVEL 1 |
| R7 | 1000 | LEVEL 1 |
| R8 (weak) | 1000 | LEVEL 3 |
| R9 | 2000 | LEVEL 1 |
| R10 | 1000 | LEVEL 1 |

FIG. 9

| ROW ADDRESS | ACCESS COUNT | HEALTH LEVEL | VICTIM COUNT | VICTIM DEGREE |
|---|---|---|---|---|
| R1 | 0 | LEVEL 1 | 2000(R2) | 2000 |
| R2 | 2000 | LEVEL 1 | 3000 | 3000 |
| R3 (weak) | 3000 | LEVEL 2 | 2000(R2)+2000(R4) | 4000*2 |
| R4 | 2000 | LEVEL 1 | 3000(R3) | 3000 |
| R5 | 0 | LEVEL 1 | 2000(R4)+2000(R6) | 4000 |
| R6 | 2000 | LEVEL 1 | 1000(R7) | 1000 |
| R7 | 1000 | LEVEL 1 | 2000(R6)+1000(R8) | 3000 |
| R8 (weak) | 1000 | LEVEL 3 | 1000(R7)+2000(R9) | 3000*3 |
| R9 | 2000 | LEVEL 1 | 1000(R8)+1000(R10) | 2000 |
| R10 | 1000 | LEVEL 1 | 2000(R9) | 2000 |

FIG. 11

| ROW ADDRESS | ACCESS COUNT | HEALTH LEVEL | WEIGHTED ACCESS COUNT | VICTIM DEGREE |
|---|---|---|---|---|
| R1 | 0 | LEVEL 1 | 0 | 2000*2 (R2) |
| R2 | 2000 | LEVEL 2 | 2000*2 | 3000 (R3) |
| R3 (weak) | 3000 | LEVEL 1 | 3000 | 2000*2 (R2)+ 2000*2 (R4) |
| R4 | 2000 | LEVEL 2 | 2000*2 | 3000 (R3) + 0 (R5) |
| R5 | 0 | LEVEL 1 | 0 | 2000*2 (R4)+ 2000 (R6) |
| R6 | 2000 | LEVEL 1 | 2000 | 0 (R5)+ 1000*3 (R7) |
| R7 | 1000 | LEVEL 3 | 1000*3 | 2000 (R6)+ 1000 (R8) |
| R8 (weak) | 1000 | LEVEL 1 | 1000 | 1000*3 (R7)+ 2000*3 (R9) |
| R9 | 2000 | LEVEL 3 | 2000*3 | 1000 (R8)+ 1000 (R10) |
| R10 | 1000 | LEVEL 1 | 1000 | 2000*3 (R9) |

MEMORY DEVICE AND OPERATING METHOD WITH MECHANISM TO DETERMINE VICTIM ROWS FOR REFRESHING

CROSS-REFERENCE TO RELATED APPLICATION

Korean Patent Application No. 10-2022-0168666, filed in the Korean Intellectual Property Office, on Dec. 6, 2022, is incorporated herein by reference in its entirety.

BACKGROUND

1. Field

A memory device and an operation method of the memory device is disclosed.

2. Description of the Related Art

The integration and speed of memory devices widely used in high-performance electronic systems are increasing, and the manufacturing process of memory devices is also being miniaturized.

SUMMARY

Embodiments are directed to a memory device including a memory cell array including a plurality of rows, an error correction code (ECC) engine configured to determine a health level for each of the plurality of rows based on a number of corrections of errors of data read from each of the plurality of rows, a control logic configured to determine a victim row address based on the health level and a number of accesses for each of the plurality of rows, and a refresh control circuit configured to perform a refresh on a row corresponding to the determined victim row address.

The control logic may include an access counter counting the number of accesses to the row address of each of the plurality of rows, and a register storing access data including the number of accesses to the row address and the row address.

The control logic may include an access counter configured to count the number of accesses to the row address of each of the plurality of rows, and the access data including the row address and the number of accesses to the row address are stored in memory cells within the memory cell array.

The ECC engine may include an ECC encoding circuit configured to generate parity bits related to write data written into the memory cell array and may store the write data and the parity bits in the memory cell array, an ECC decoding circuit configured to generate an error occurrence signal while correcting an error in read data read from the memory cell array by using the read data and the parity bits, and a health level generator may be configured to determine a number of error occurrences for each of the plurality of rows by counting the error occurrence signals, and may determine the health level for each of the plurality of rows by comparing the number of error occurrences with a preset threshold.

The number of occurrences of a first error for a first row among the plurality of rows may be greater than the number of occurrences of a second error for a second row among the plurality of rows, a health level of the first row may be higher than a health level of the second row.

The control logic may calculate a number of damage occurrences of a first row, which may be the sum of a number of accesses to two rows adjacent to the first row among the plurality of rows, and the control logic may calculate a victim degree of the first row by multiplying a health level for the first row and the number of damage occurrences of the first row.

The control logic may determine a row address of a row having a greater victim degree than a predetermined reference among the plurality of rows as a victim row address.

The control logic may determine the row address of the row with the greatest victim degree as the victim row address.

The control logic may calculate a weighted access count for each of the plurality of rows by multiplying the number of accesses for each of the plurality of rows by the health level for each of the plurality of rows, and the control logic may calculate a victim degree of a first row by adding the weighted access count of two rows adjacent to the first row among the plurality of rows.

Embodiments are directed to a memory system including a memory controller providing a command and an address, and a memory device including a memory cell array including a plurality of rows, determines a victim row address based on a value obtained by multiplying a number of accesses to each of the plurality of rows by the command and address and health levels of the plurality of rows, and performs a refresh on a row corresponding to the determined victim row address.

The memory device may determine a health level for each of the plurality of rows based on a number of error corrections of data read from each of the plurality of rows, and the memory device may set the memory controller to not access a row with a health level exceeding a predetermined level.

The memory device may calculate a number of damage occurrences of a first row, which is the sum of a number of accesses to two rows adjacent to the first row among the plurality of rows, the memory device may calculate a victim degree of the first row by multiplying a health level for the first row and the number of damage occurrences of the first row, and the memory device may determine the victim row address based on the victim degree.

The memory device may calculate a weighted access count for each of the plurality of rows by multiplying a number of accesses for each of the plurality of rows by the health level for each of the plurality of rows, the memory device may calculate a victim degree of a first row by adding the weighted access count of two rows adjacent to the first row among the plurality of rows, and the memory device may determine the victim row address based on the victim degree.

Embodiments are directed to an operation method of a memory device, the operation method including generating health data including a health level of each of a plurality of rows included in a memory cell array based on the number of error corrections of data read from each of the plurality of rows, determining a victim row address based on the health data and the number of accesses for each of the plurality of row, and refreshing the determined victim row address.

The generating the health data may include performing an ECC operation for generating an error generation signal while correcting an error in read data read from each of the plurality of rows based on the read data and parity data, generating error data including a row address of a row in which the error is corrected and the number of error corrections for the row address, and determining a health level for each row address of the plurality of rows by comparing the error data with a predetermined threshold value.

The determining the victim row address may include calculating the number of damage occurrences for each of the plurality of rows, calculating a victim degree of each of the plurality of rows by multiplying a health level for each of the plurality of rows and the number of damage occurrences for each of the plurality of rows, and determining the victim row address based on a victim degree of each of the plurality of rows.

Calculating the number of damage occurrences may include calculating the number of times of damage occurrences of a first row by adding a number of accesses to two rows adjacent to the first row among the plurality of rows.

The determining the victim row address may include calculating a weighted access count for each of the plurality of rows based on an access count for each of the plurality of rows and a health level for each of the plurality of rows, calculating a victim degree for each row of the plurality of rows based on a weighted access count for each of the plurality of rows, and determining the victim row address based on the victim degree of each of the plurality of rows.

The calculating the victim degree may include calculating a victim degree of a first row among the plurality of rows by adding a weighted access count for two rows adjacent to the first row.

The determining the victim row address based on the victim degree of each of the plurality of rows may include determining a row address of a row having the greatest victim degree based on a victim degree of each of the plurality of rows as the victim row address.

BRIEF DESCRIPTION OF THE DRAWINGS

Features will become apparent to those of skill in the art by describing in detail exemplary embodiments with reference to the attached drawings in which:

FIG. 5 is a table showing access data and health data according to an example embodiment.

FIG. 9 is a table showing access data and health data for determining the victim row address of FIG. 8.

FIG. 11 is a table showing access data and health data for determining the victim row address of FIG. 10.

DETAILED DESCRIPTION

Figure 1:
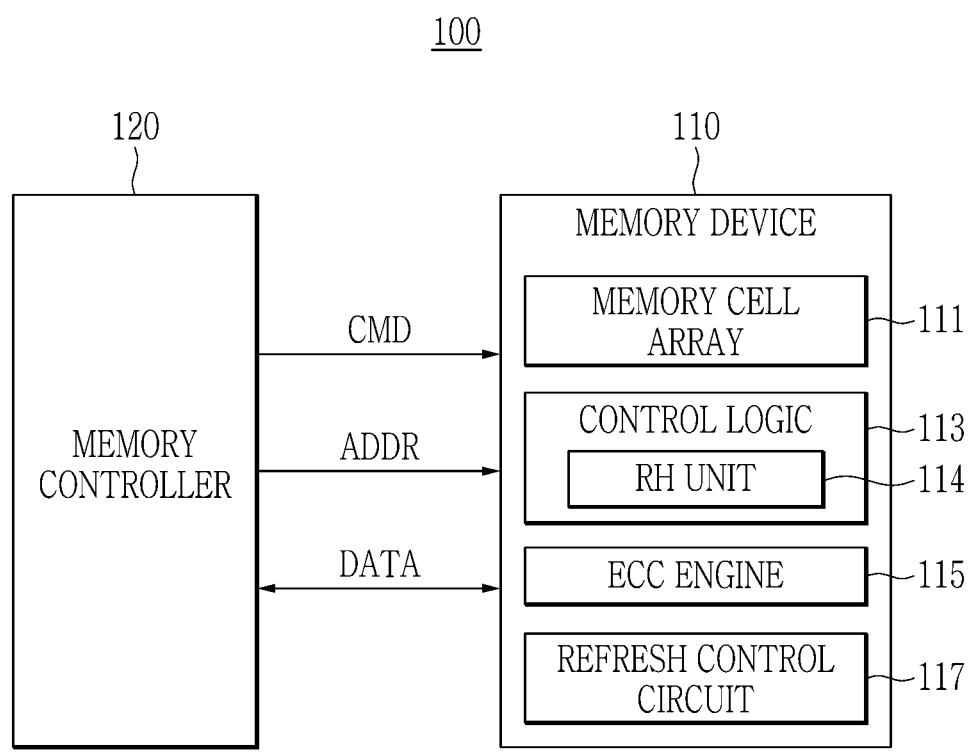
FIG. 1 is a block diagram showing an example embodiment of a memory system.

FIG. 1 is a block diagram showing an example embodiment of a memory system. Referring to FIG. 1, a memory system 100 may include a memory device 110 and a memory controller 120. In some embodiments, the memory device 110 and the memory controller 120 may be connected through a memory interface and may exchange signals through the memory interface.

The memory controller 120 may control the memory operation of the memory device 110 by providing a signal to the memory device 110. The signal may include a command CMD and an address ADDR. In some embodiments, the memory controller 120 may provide commands CMDs and addresses ADDRs to the memory device 110 to access a memory cell array 111 and control memory operations such as reading or writing. Data may be transferred from the memory cell array 111 to the memory controller 120 according to a read operation, and data may be transferred from the memory controller 120 to the memory cell array 111 according to a write operation.

The command CMD may include an activate command, a read/write command or a refresh command. In some embodiments, the command CMD may further include a precharge command. The activate command may be a command that activates a target row of the memory cell array 111 to write data to or read data from the memory cell array 111. The read/write command may be a command for performing a read or write operation in a target memory cell of an activated row. The refresh command may be a command for performing a refresh operation in the memory cell array 111. As used herein, the term "or" is not an exclusive term, e.g., "A or B" would include A, B, or A and B.

In some embodiments, the memory controller 120 may access the memory device 110 upon a request from an external host of the memory system 100. The memory controller 120 may communicate with the host using various protocols.

The memory device 110 may be a storage device based on a semiconductor element. In other words, the storage device may be a semiconductor storage device. In some embodiments, the memory device 110 may include a DRAM device. In some embodiments, the memory device 110 may include other memory devices for which refresh operations may be used.

The memory device 110 may receive or output data DATA through data lines or perform a refresh operation in response to the address ADDR and the command CMD received from the memory controller 120. The memory device 110 may include a memory cell array 111, a control logic 113, an ECC engine 115, and a refresh control circuit 117.

The memory cell array 111 may include a plurality of memory cells defined by a plurality of rows and a plurality of columns. In some embodiments, rows may be defined by word lines and columns may be defined by bit lines.

The control logic 113 may control the overall operation of the memory device 110. The control logic 113 may include a row-hammer (RH) unit 114. The RH unit 114 may determine whether to perform one of a target refresh operation and a normal refresh operation in response to a refresh command of the memory controller 120.

In addition, the RH unit 114 may determine a victim row address that may be the target of the target refresh operation. In an implementation, the RH unit 114 may detect an aggressor row among a plurality of rows, determine a row address (referred to as a victim row address) of the victim row to be refreshed based on the row address (referred to as an attack row address) of the attack row, and output the victim row address to the refresh control circuit 117. In some embodiments, the attack row may be a row-hammer attack row, and the victim row may be a row subject to row-hammer care.

The ECC engine 115 may correct errors in read data read from the memory cell array 111. In an implementation, the ECC engine 115 may detect an error in the read data read from the memory cell array 111 under the control of the control logic 113, generate an error generation signal, correct the error, and output error-corrected read data. In addition, the ECC engine 115 may generate parity bits for write data to be written to the memory cell array 111 under the control of the control logic 113, and the generated parity bits may be written in the memory cell array 111 together with the write data.

The ECC engine 115 may perform a scrubbing operation, that is, an error check and scrub (ECS) operation, according to a predetermined method. In an implementation, the ECC engine 115 may sequentially read data from the memory cell array 111 from a page corresponding to the received address, generate an error occurrence signal by detecting errors in the read data, and correct the error and store the error-corrected data in the memory cell array 111. In some embodiments, a predetermined method may be a method of sequentially performing scrubbing in a forward direction while counting up in the memory cell array 111 from the received address. In some embodiments, the predetermined method may be a method in which scrubbing proceeds in a reverse direction while counting down within the memory cell array 111 from the received address. In some embodiments, a predetermined method may be a method in which scrubbing proceeds by randomly counting up within the memory cell array 111 from the received address. In some embodiments, the predetermined method may be a method in which the scrubbing is resumed from the next address after stopping the scrubbing in a page corresponding to a specific address. The ECC engine 115 may periodically perform ECS operation.

The ECC engine 115 may generate error data including an error-corrected address and the number of error-corrected errors for the address based on the error generation signal generated when an error is detected. The error data may be updated as the ECC engine 115 performs an ECC operation or an ECS operation.

In some embodiments, the ECC engine 115 may determine a health level of each row address based on the error data. The health level may be a level representing the relative health of a row. The health of a row may be an index indicating the degree to which data is degraded due to coupling between adjacently positioned rows when a certain row is active and precharged due to intensive access by the memory controller 120. In an implementation, the health level may be a level that shows resistance that can withstand an influence of a charge of a memory cell connected to an adjacent row of an arbitrary row, which is attacked.

In some embodiments, the ECC engine 115 may assign higher health levels to rows that are more vulnerable to attack. In an implementation, a first row in the memory cell array 111 may have a first health level, and a second row may have a second health level. In this case, when a row adjacent to the first row is attacked, a memory cell connected to the first row may be affected more than a memory cell connected to the second row when a row adjacent to the second row is attacked. In an implementation, the memory cell connected to the second row may be more vulnerable to attack.

In some embodiments, the ECC engine 115 may determine a health level based on the number of error corrections for a given row address. Meanwhile, a health level for each row address may be changed according to the update of error data.

In some embodiments, the memory device 110 may set the memory controller 120 to not access rows having a higher health level than a certain level. In an implementation, the memory device 110 may be configured to not access a row having a higher health level than a fourth level, and the first row may have a health level of the fourth level. In this case, upon receiving a first address ADDR indicating the first row and a first command CMD targeting the first row from the memory controller 120, the memory device 110 may not execute the received first command CMD. In another embodiment, when an access command for a row having a higher health level than a certain level is received from the memory controller 120, the memory device 110 may set to access another spare row of the certain level instead of a row having a higher health level than the certain level. In an implementation, when the memory device 110 receives an access command for a first row having a higher health level than the fourth level from the memory controller 120, the memory device 110 may be set to access the third row instead of the first row. In this case, the third row may be a spare row set in advance to replace a row having a higher health level than a certain level. In an implementation, when receiving a first address ADDR indicating the first row and a first command CMD targeting the first row from the memory controller 120, the memory device 110 may execute a first command CMD for the third row. The spare row may be in an arbitrary region within the memory cell array 111 or in a separate memory cell array other than the memory cell array 111.

Meanwhile, the memory device 110 may transmit information including a health level for each row to the memory controller 120. In this case, the memory controller 120 may not access a row having a higher health level than a certain level based on the received information.

The refresh control circuit 117 may perform a normal refresh operation or a target refresh operation under the control of the control logic 113. In some embodiments, when the RH unit 114 decides to perform a normal refresh operation, the refresh control circuit 117 may sequentially refresh a plurality of rows of the memory cell array 111. In an implementation, the normal refresh may include auto-refresh performed when the memory device 110 is in use and self-refresh performed when the memory device 110 is idle.

In some embodiments, the refresh control circuit 117 may refresh a target row when the RH unit 114 determines to perform a target refresh operation. In an implementation, the target row may be a row corresponding to a victim row address received from the RH unit 114.

Figure 2:
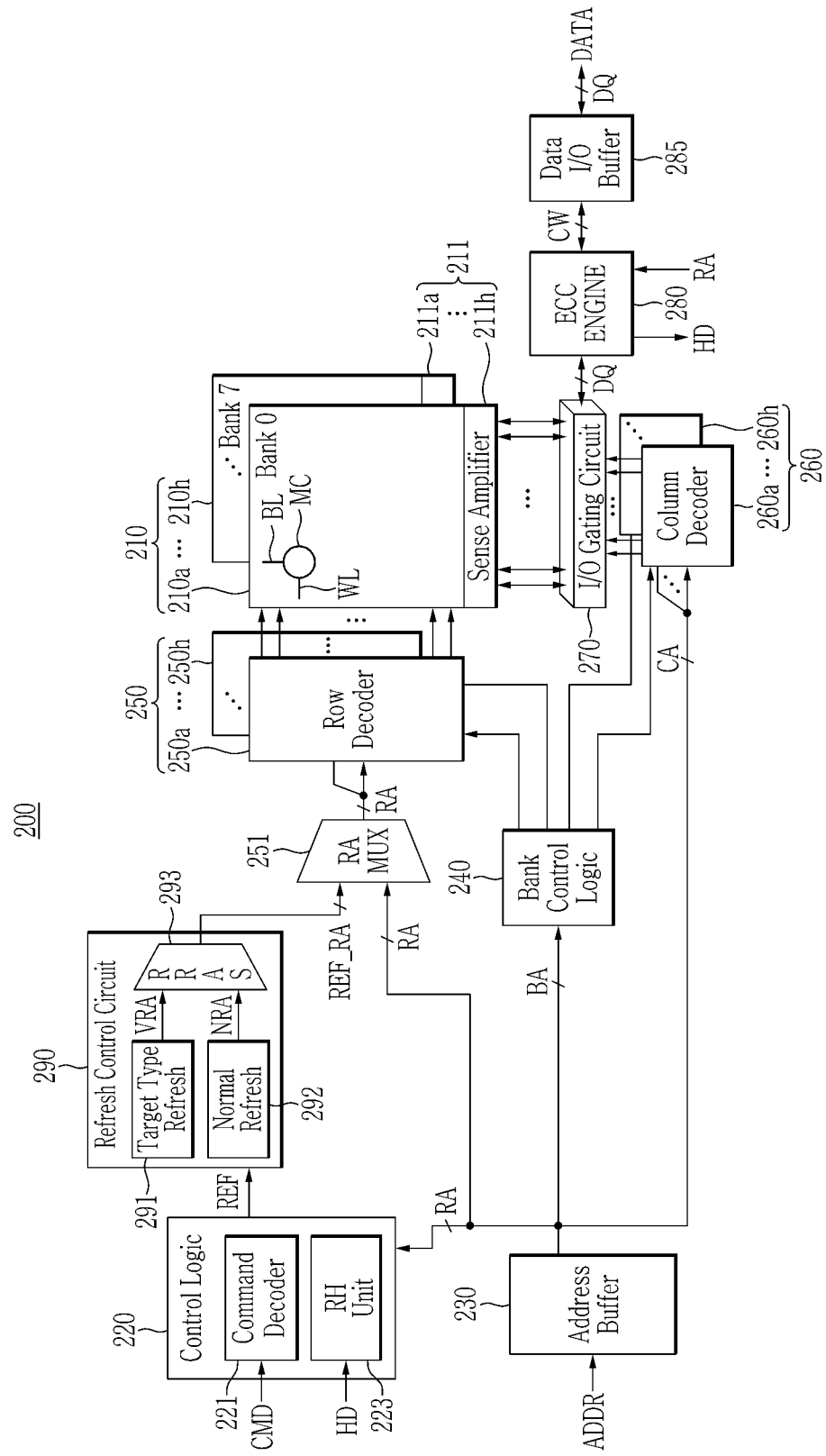
FIG. 2 is a block diagram showing an example embodiment of a memory device.

FIG. 2 is a block diagram showing an example embodiment of a memory device. Referring to FIG. 2, a memory device 200 may include a memory cell array 210, a sense amplifier 211, a control logic 220, an address buffer 230, a row decoder 250, a column decoder 260, an input and output (I/O) gating circuit 270, an ECC engine 280, a data I/O buffer 285, and a refresh control circuit 290.

The memory cell array 210 may include a plurality of memory cells MC. In some embodiments, the memory cell array 210 may include a plurality of memory banks 210*a* to 210*h*. In FIG. 2, eight memory banks BANK0 to BANK7 210*a* to 210*h* are shown. Each of the memory banks 210*a* to 210*h* may include a plurality of rows, a plurality of columns, and a plurality of memory cells MC arranged at intersections of a plurality of rows and a plurality of columns. In some embodiments, a plurality of rows may be defined by a plurality of word lines WL, and a plurality of columns may be defined by a plurality of bit lines BL.

The control logic 220 may include a command decoder 221 and a row-hammer (RH) unit 223. The command decoder 221 may generate a control signal such that the memory device 200 performs a read operation, write operation, or refresh operation. The command decoder 221 may generate a refresh command REF by decoding the command CMD received from the memory controller (e.g., 120 of FIG. 1).

The RH unit 223 may control the refresh control circuit 290 to generate a refresh row address REF_RA in response to a refresh command. The RH unit 223 may determine a victim row address to perform a target refresh operation based on the number of accesses to the memory cell array 210 and health data HD received from the ECC engine 280. The health data HD may include information about a health level corresponding to each row of the memory cell array 210. In some embodiments, the RH unit 223 may determine the most damaging row address as the victim row address. A method by which the RH unit 223 determines the victim row address will be described in detail later with reference to FIG. 8 and FIG. 10.

In some embodiments, the control logic 220 may output the refresh command REF including the victim row address determined by the RH unit 223 to the refresh control circuit 290 when performing a target refresh operation.

The address buffer 230 may receive the address ADDR provided from the memory controller 120. The address ADDR may include a row address RA indicating a row of the memory cell array 210 and a column address CA indicating a column. The row address RA may be provided by the row decoder 250, and the column address CA may be provided by the column decoder 260. The row address RA may be provided to the refresh control circuit 290 through the command decoder 221 or directly to the refresh control circuit 290. In some embodiments, the row address RA may be provided to the row decoder 250 via a row address multiplexer 251. In some embodiments, the address ADDR may further include a bank address BA indicating a memory bank.

In some embodiments, the memory device 200 may further include the row address multiplexer 251. The row address multiplexer 251 may receive the row address RA from the address buffer 230 and the row address REF_RA to be refreshed from the refresh control circuit 290. The row address multiplexer 251 may selectively output the row address RA received from the address buffer 230 and the row address REF_RA received from the refresh control circuit 290 to the row decoder 250.

The row decoder 250 may select a row to be activated from among a plurality of rows of the memory cell array 210 based on the row address RA or REF_RA. To this end, the row decoder 250 may apply a driving voltage to a word line corresponding to a row to be activated. In some embodiments, a plurality of row decoders 250a to 250h respectively corresponding to a plurality of memory banks 210a to 210h may be provided.

The column decoder 260 may select a column to be activated from among a plurality of columns of the memory cell array 210 based on the column address. To this end, the column decoder 260 may activate the sense amplifier 211 corresponding to the column address CA through the I/O gating circuit 270. In some embodiments, a plurality of column decoders 260a to 260h respectively corresponding to a plurality of memory banks 210a to 210h may be provided.

The I/O gating circuit 270 gates input and output data, and may include a data latch for storing data read from the memory cell array 210 and a write driver for writing data to the memory cell array 210.

A code word CW may be stored in data latches. The code word CW to be read from one of the first to eighth memory banks 210a to 210h may be sensed by the sense amplifiers 211a to 211h corresponding to one bank array and the I/O gating circuit 270. In some embodiments, the plurality of sense amplifiers 211a to 211h respectively corresponding to the plurality of memory banks 210a to 210h may be provided. The ECC engine 280 may perform ECC decoding on the code word CW stored in data latches. When an error is detected in the code word CW data, the ECC engine 280 may generate an error occurrence signal while correcting the error, and may provide corrected data DQ to the memory controller 120 through the data input and output buffer 285.

Data DQ to be written to one of the first to eighth memory banks 210a to 210h may be provided to the ECC engine 280, and the ECC engine 280 generates parity bits based on the data DQ and provides the data DQ and parity bits to the I/O gating circuit 270. The I/O gating circuit 270 may write data DQ and parity bits to a subpage of one memory bank through write drivers in the I/O gating circuit 270.

The ECC engine 280 may perform ECC decoding on the code word CW read from each row on which the refresh operation was performed, in a section in which a refresh operation may be performed on a plurality of rows included in the memory cell array 210. The ECC engine 280 may perform the ECC decoding by reading the code word CW from each of subpages that form one row. When an error is detected in data of the code word CW read from each row, the ECC engine 280 may perform a scrubbing operation that corrects the error, may generate an error occurrence signal, and may write the corrected data DQ to the corresponding subpage again.

The ECC engine 280 may receive the row address RA from the address buffer 230. In some embodiments, the ECC engine 280 may count error occurrence signals for each row included in the memory cell array 210 and generate error data including the number of error occurrences for each row address RA. The ECC engine 280 may determine a health level based on error data. The ECC engine 280 may output health data HD including a health level for each row of the memory cell array 210.

In some embodiments, the memory device 200 may further include a bank control logic 240 to generate a bank control signal in response to the bank address BA. In response to the bank control signal, a row decoder 250 corresponding to the bank address BA among a plurality of row decoders 250a to 250h may be activated, and a column decoder 260 corresponding to the bank address BA among a plurality of column decoders 260a to 260h may be activated.

In some embodiments, data (e.g., data stored in a data latch) read from the memory cell array 210 may be provided to the data I/O buffer 285 through the ECC engine 280 and transferred to the memory controller 120. Data to be written in the memory cell array 210 may be provided to the data I/O buffer 285 from the memory controller 120, and data provided to the data I/O buffer 285 may be provided to the I/O gating circuit 270 through the ECC engine 280.

The refresh control circuit 290 may transmit a row address REF_RA to be refreshed to the row decoder 250 in response to a refresh command REF. In some embodiments, the refresh control circuit 290 may include a target-type refresh control circuit 291, a normal refresh control circuit 292, and a refresh row address selector (RRAS) 293. The target-type refresh control circuit 291 may output a victim row address received from the RH unit 223 as a target row address VRA in response to a target-type refresh command. The normal refresh control circuit 292 may calculate a row address NRA where a normal refresh operation may be performed, and may output the row address NRA in response to a normal refresh command. The refresh row address selector 293 may selectively output a row address (VRA) from the target-type refresh control circuit 291 or a row address (NRA) from the normal refresh control circuit 292. In some embodiments, the refresh row address selector 293 may output the row address NRA from the normal refresh control circuit 292 as the refresh row address REF_RA in response to a normal refresh command, and may output the refresh row address REF_RA from the target refresh control circuit 291 to the row address VRA in response to a target refresh command.

Figure 3:
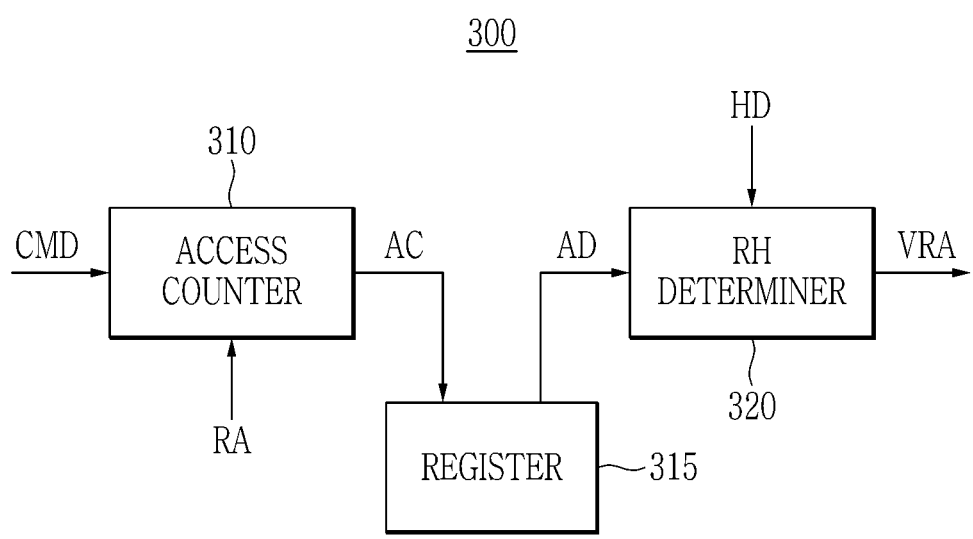
FIG. 3 is a block diagram showing an example embodiment of a row-hammer.

FIG. 3 is a block diagram showing an example embodiment of a row-hammer (RH). Referring to FIG. 3, the RH unit 300 according to an embodiment may include an access counter 310, a register 315, and a row-hammer (RH) determiner 320.

The access counter 310 may receive the row address RA from the command CMD and the address buffer 230 as received from the memory controller 120 (FIG. 1), and may count the number of accesses to the row address RA. In some embodiments, the access counter 310 may store the access count AC for each row address in the register 315. In an implementation, the access counter 310 may store the number of times of access in a corresponding position in the register 315. In an implementation, a row address may be pre-stored in the register 315, and the access counter 310 may match and store the number of times of access to an arbitrary row address with a corresponding row address.

The register 315 may store access data AD including the number of accesses AC for each row address. The register 315 has been described as a component within the RH unit 300, and it may be a separate memory within the memory device 200 (FIG. 2). In addition, the access data AD may be stored in a memory cell in the memory cell array 210 (FIG. 2) instead of being stored in the register 315.

The RH determiner 320 may read the access data AD from the register 315. The RH determiner 320 may detect the number of accesses to an arbitrary row address based on the access data AD. In addition, the RH determiner 320 may determine a victim row address VRA based on the health data HD transmitted from the ECC engine 380. In some embodiments, the RH determiner 320 may perform an operation of determining the victim row address VRA based on the access data AD and the health data HD at predetermined intervals.

In an implementation, the RH determiner 320 may detect the number of accesses to the first row and the number of accesses to each of two rows adjacent to the first row in the access data AD. The RH determiner 320 may detect the health level of the first row in the health data HD. The RH determiner 320 may calculate the number of damage occurrences by adding the number of accesses to each of the two rows adjacent to the first row, and multiplying the calculated number of damage occurrences by the health level of the first row to calculate a victim degree to the first row. The number of times of damage may be the number of times of damage received by a row positioned adjacent to a corresponding row when an arbitrary row is accessed. In a similar way, the RH determiner 320 may calculate the victim degree for all rows. The victim degree may be a quantitative representation of damage suffered by the row. The RH determiner 320 may determine an address of a row having the highest victim degree as a victim row address.

For another example, the RH determiner 320 may detect the number of accesses to the first row and the number of accesses to each of two rows adjacent to the first row in the access data AD. The RH determiner 320 may detect a health level for the first row and a health level for each of two rows adjacent to the first row within the health data HD. The RH determiner 320 may calculate a weighted access count by multiplying the number of accesses to the first row by the health level of the first row, and by multiplying the number of accesses to each of two rows adjacent to the first row by each health level. The RH determiner 320 may calculate the victim degree of the first row by adding the weighted access counts for each of the two adjacent rows to the first row. In a similar way, the RH determiner 320 may calculate the victim degree for all rows. The RH determiner 320 may determine an address of a row having the highest victim degree as a victim row address.

With reference to FIG. 3, it has been described how the RH unit 300 may calculate the victim degree to each row or calculate the weighted number of accesses by multiplying the number of times of damage or the number of accesses for each row by the health level. In some embodiments, when counting the number of accesses for each row, the RH unit 300 may adjust the range of increase in the number of accesses in consideration of the health level of each row. In this case, the RH unit 300 may not perform an operation of multiplying the health level.

The RH determiner 320 may transmit a refresh command REF including a victim row address VRA to the refresh control circuit 290 (FIG. 2). When the RH determiner 320 transmits the refresh command REF to the refresh control circuit 290, the access count AC for each row may be initialized to 0.

Figure 4:
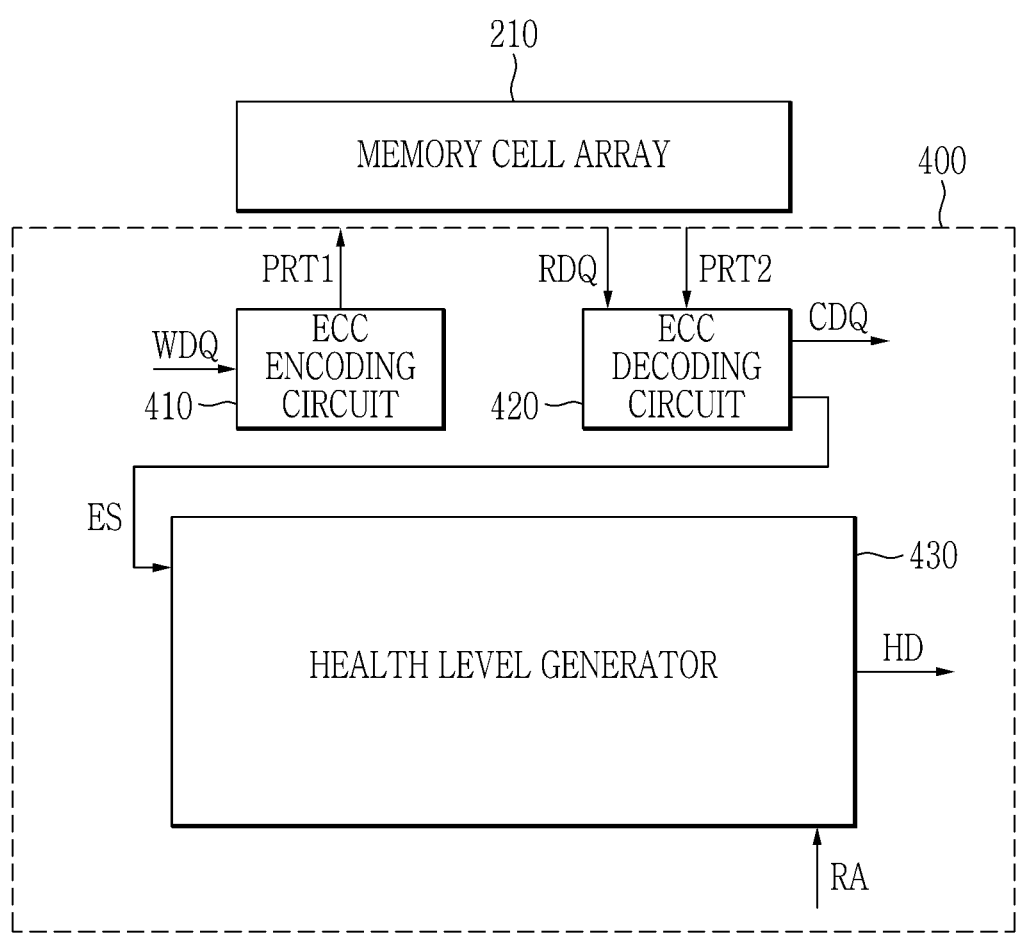
FIG. 4 is a block diagram showing an example embodiment of an ECC engine.

FIG. 4 is a block diagram showing an example embodiment of an ECC engine. The ECC engine 400 may include an ECC encoding circuit 410, an ECC decoding circuit 420, and a health level generator 430. For convenience of explanation, FIG. 4 shows that the ECC engine 400 may be directly connected to the memory cell array 210 (FIG. 2), and the ECC engine 400 may be connected to the memory cell array 210 through the I/O gating circuit 270 (FIG. 2).

The ECC encoding circuit 410 may generate parity bits PRT1 related to write data WDQ to be written to the memory cells of the memory cell array 210. The parity bits PRT1 may be stored in the memory cell array 210.

The ECC decoding circuit 420 may correct errors using read data RDQ read from the memory cells of the memory cell array 210 and read parity bits PRT2, and output error-corrected data CDQ. The parity bit PRT2 may be the same as the parity bit PRT1. In some embodiments, the ECC decoding circuit 420 may generate an error occurrence signal ES while correcting errors. The ECC decoding circuit 420 may transmit the error generation signal ES to the health level generator 430.

The health level generator 430 may receive the error generation signal ES from the ECC decoding circuit 420. In addition, the health level generator 430 may receive a row address RA from the address buffer 230 (FIG. 2). In some embodiments, the health level generator 430 may determine the number of error occurrences for each row address RA by counting the error occurrence signal ES for each row address RA. The health level generator 430 may generate error data including the number of occurrences of errors for the row address RA and the row address RA.

In some embodiments, the health level generator 430 may determine a health level based on error data. In an implementation, the health level generator 430 may store a threshold value. The threshold value may be, e.g., a predetermined value in response to the command CMD provided from the memory controller 120 (FIG. 1). In some embodiments, the number of threshold values may be set in proportion to the number of health levels. The health level generator 430 may determine the health level based on a comparison result obtained by comparing the number of occurrences of errors with the threshold value and the row address CA from the address buffer 230.

In some embodiments, the health level generator 430 may determine that the corresponding row address CA has a first level health level when the number of occurrences of errors is less than a first threshold value. When the number of error occurrences exceeds the first threshold value and is less than the second threshold value, the health level generator 430 may determine that the corresponding row address CA has a second level health level. When the number of error occurrences exceeds the second threshold value and is less than the third threshold value, the health level generator 430 may determine that the corresponding row address CA has a third level health level.

In addition, the health level generator 430 may generate health data HD including a row address CA and a health level for a corresponding row. In an implementation, the health level generator 430 has a health level of the first level when the number of error corrections for the first row address is less than 10, and when the number of error corrections for the second row address is 10 or more and less than 100, the health level generator 430 has a health level of the second level, and it may be determined that the health level generator 430 has a health level of the third level when the number of errors corrected for the third row address is 100 or more. In this case, the health level generator 430 may generate health data HD including information about the first row address of the first level, the second row address of the second level, and the third row address of the third level.

Meanwhile, the health data HD generated by the health level generator 430 may be stored in a separate register or may be stored in a memory cell in the memory cell array 210. In some embodiments, the health level generator 430 may generate health data HD including only addresses of a weak row in the memory cell array 210 and health level information for each row. When the number of vulnerable rows among a plurality of rows in the memory cell array 210 (FIG. 2) is less than a certain level, the health level generator 430 may store the health data in a separate register because much storage capacity is not required to store the health data HD.

FIG. 5 is a table showing access data and health data according to an example embodiment. As described above, the access data AD may be stored in a register 315 (FIG. 3) or any memory cell of the memory cell array 210, and the health data HD may be generated in an ECC engine 400 (FIG. 4) and then stored in a separate register or any memory cell of the memory cell array 210.

As shown in FIG. 5, a random memory cell array may include a first row R1 to a tenth row R10. The control logic 220 may count the number of accesses to each row and generate access data including the number of accesses to each row.

As shown in FIG. 5, the number of accesses to the first row R1 may be 0 times. The number of accesses to a second row R2 may be 2000 times. The number of accesses to a third row R3 may be 3000 times. The number of accesses to a fourth row R4 may be 2000 times. The number of accesses to a fifth row R5 may be 0 times. The number of accesses to a sixth row R6 may be 2000 times. The number of accesses to a seventh row R7 may be 1000 times. The number of accesses to an eighth row R8 may be 1000 times. The number of accesses to a ninth row R9 may be 2000 times. The number of accesses to a tenth row R10 may be 1000 times.

The control logic 220 may receive the health level for each row address from the ECC engine 280. The ECC engine 280 may determine a health level for each row. The ECC engine 280 may generate health data including health levels for each of the first to tenth rows R1 to R10.

The first row R1, the second row R2, the fourth row R4, the fifth row R5, the sixth row R6, the seventh row R7, the ninth row R9, and the tenth row R10 may have a health level of the first level. The third row R3 may have a second level of health, and the eighth row R8 may have a third level of health. In an implementation, the third row R3 and the eighth row R8 may be weak or vulnerable to row-hammer attack.

Figure 6:
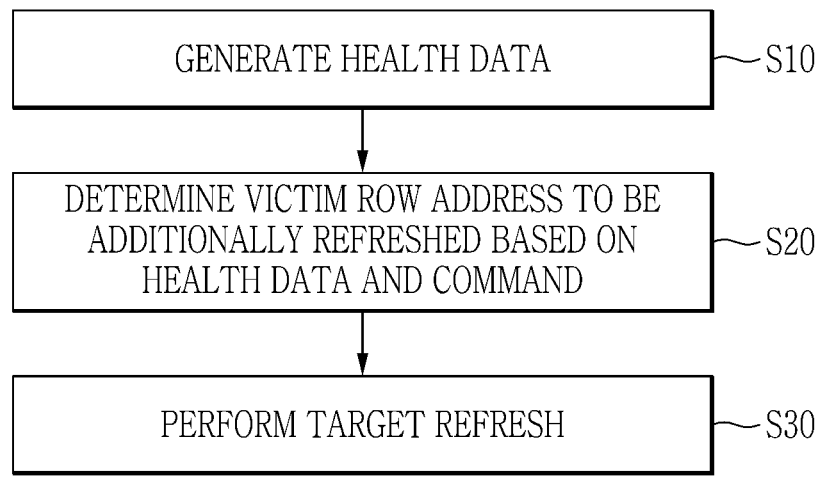
FIG. 6 is a flowchart showing steps in an operation method of the memory device according to an example embodiment.

FIG. 6 is a flowchart showing steps in an operation method of the memory device according to an example embodiment. Referring to FIG. 6, the ECC engine 280 (FIG. 2) generates health data (S10).

The health data may include a health level for each row of the memory cell array 210. The ECC engine 280 may transmit the generated health data to the control logic 220 (FIG. 2). The control logic 220 may determine a victim row address that is an additional refresh target based on the health data and command (S20).

The control logic 220 may determine the victim row address that has received the most severe damage based on the number of accesses to each row counted based on the health data and command for each row received from the ECC engine 280. In an implementation, the control logic 220 may determine a victim row address based directly on health data and the number of accesses to each row.

Meanwhile, the control logic 220 may determine a victim row address based on health data and the number of times of damage to a row adjacent to the accessed row. A method for the control logic 220 to determine the victim row address may be set in advance.

The control logic 220 may transmit the determined victim row address to the refresh control circuit 290. The refresh control circuit 290 may perform a target refresh to refresh the victim row address (S30).

Figure 7:
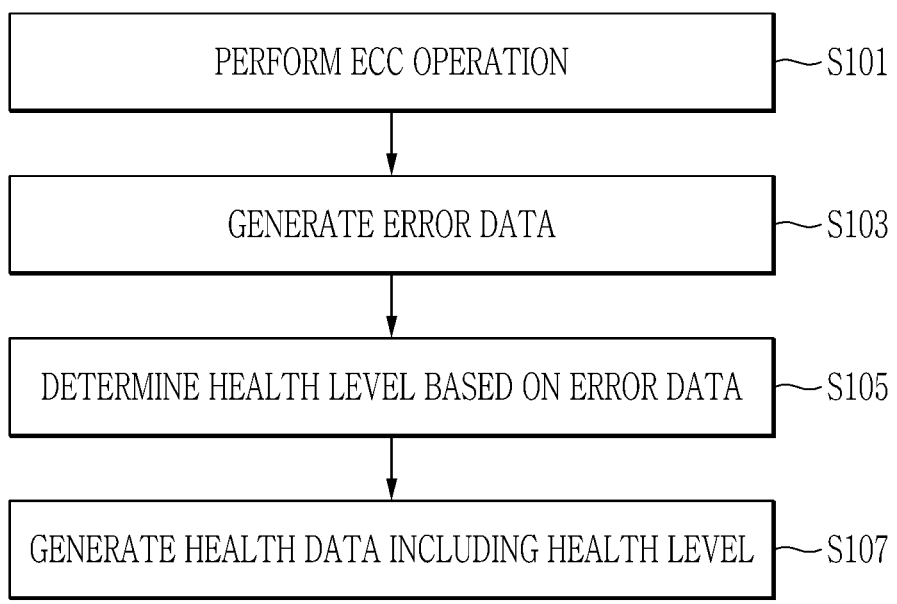
FIG. 7 is a flowchart showing steps in a method for generating health data according to an example embodiment.

FIG. 7 is a flowchart showing steps in a method for generating health data according to an example embodiment. The flowchart of FIG. 7 shows in detail step S10 of FIG. 6. First, the ECC engine 280 may perform an ECC operation (S101). The ECC engine 280 may generate an error occurrence signal when an error is detected while performing an ECC operation. In addition, the ECC engine 280 may receive the row address RA from the address buffer 230.

The ECC engine 280 may generate error data (S103). The ECC engine 280 may determine the number of error occurrences for each row by counting the error occurrence signal for each row. The ECC engine 280 may generate error data including an error-corrected address and the number of error-corrected errors for the address based on the number of error occurrence signals.

The ECC engine 280 may determine a health level based on the error data (S105). The health level may be a level representing relative health of a row, which may be an index indicating a degree of degradation of data due to coupling between rows that are adjacent to each other.

The ECC engine 280 may generate health data including a health level (S107). The health data may include a row address RA and health level information for a corresponding row.

Figure 8:
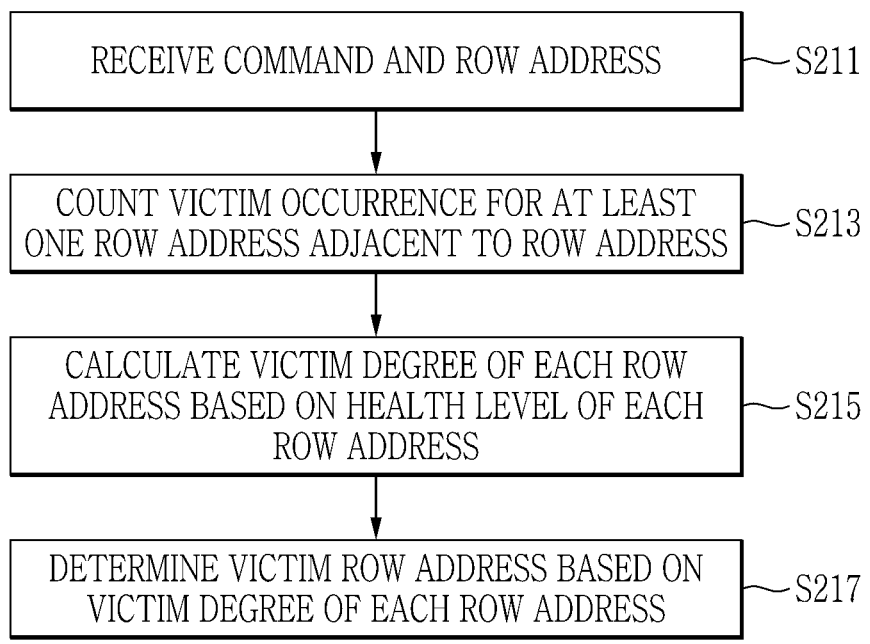
FIG. 8 is a flowchart showing steps in a method for determining a victim row address according to an example embodiment.

FIG. 8 is a flowchart showing steps in a method for determining a victim row address according to an example embodiment. FIG. 9 is a table showing access data and health data for determining the victim row address of FIG. 8. Referring to FIG. 8, the control logic 220 may receive the command CMD and row address RA (S211).

The control logic 220 may receive the command CMD from the memory controller 120 (FIG. 1) and receive the row address RA from the address buffer 230. In addition, the control logic 220 may receive health data HD from the ECC engine 280.

Next, the control logic 220 may count the number of times of damage to at least one row address adjacent to the row address RA S213. The number of times of damage may be the number of times of damage received by a row adjacent to the corresponding row when an arbitrary row is accessed. In some embodiments, the control logic 220 may count the number of damage occurrences to an adjacent row based on the number of accesses to a particular row within the access data.

In some embodiments, the control logic 220 may increase the number of accesses to rows adjacent to a specific row within access data whenever a command CMD for a specific row is received. In an implementation, the control logic 220 may increase the number of accesses by reflecting the health level of each row for every access within a predetermined time and weighting the victim degree to each row. In another embodiment, when receiving a refresh command from the memory controller 120, the control logic 220 may calculate the number of damage occurrences of each row based on the number of accesses to each row in the access data.

In an implementation, as shown in FIG. 9, the number of damage occurrences to the third row R3 may be the sum of the access count to the second row R2 (e.g., 2000 times) and the access count to the fourth row R4 (e.g., 2000). The number of damage occurrences to the third row R3 may be 4000.

As another example, the number of damage occurrences to the eighth row R8 may be the sum of the access count to the seventh row R7 (e.g., 1000) and the access count to the ninth row R9 (e.g., 2000). The number of damage occurrences to the eighth row R8 may be 3000. The control logic 220 may calculate a victim degree of each row address based on the health level of each row address (S215).

The victim degree may be a quantitative representation of damage suffered by the row. In some embodiments, the control logic 220 may calculate the amount of damage in each row by multiplying the number of damage occurrences in each row by the health level of that row.

Referring to FIG. 9, the number of damage occurrences to the third row R3 is 4000, and since the third row R3 has a second level health level, the victim degree to the third row R3 may be 8000, which is 4000*2. In addition, since the number of damage occurrences in the eighth row R8 is 3000, and the eight row R8 has a third level of health, the victim degree in the eighth row R8 may be 9000, which is 3000*3. In a similar way, the control logic 220 may also calculate the victim degree to other rows. In some embodiments, the control logic 220 may calculate the final victim decree by reflecting the health level of each row for each access within a predetermined time and weighting the victim degree to each row, instead of the above method of multiplying the health level by the access count accumulated for a predetermined time. In an implementation, the control logic 220 may increase the victim degree of a row of which a health level is a first level by 1 whenever a row adjacent to the row of which the health level is the first level (e.g., first row R1) is accessed. However, whenever a row adjacent to a row of which a health level is the second level (e.g., third row R3) is accessed, the victim degree of the row of which the health level is the second level may be increased by 2, and whenever a row adjacent to a row of which a health level is a third level (e.g., eight row R8) is accessed, the victim degree of the row of which the health level is the third level may be increased by 3.

The control logic 220 may determine a victim row address based on the victim degree of each row address (S217). In some embodiments, the control logic 220 may determine a row address of a row having a victim degree that exceeds a predetermined criterion as a victim row address. This will be described with reference to FIG. 9 as an example. When the predetermined criterion is 3000, the control logic 220 may determine the row addresses of the third row R3, the fifth row R5, and the eighth row R8, which are rows of which victim degrees exceed 3000, as victim row addresses.

In some embodiments, the control logic 220 may determine the row address with the greatest victim degree as the victim row address. In an implementation, the control logic 220 may determine the eighth row R8 having the greatest victim degree of 9000 as an additional refresh target row.

In some embodiments, the control logic 220 may sequentially determine a predetermined number of row addresses as rows to be additionally refreshed, starting from row addresses having the greatest victim degree. In an implementation, when the control logic 220 sets three sequential rows having a large victim degree as victim row addresses, the control logic 220 may determine row addresses of the eighth row R8, the third row R3, and the fifth row R5 as victim row addresses.

Since the control logic 220 according to an embodiment substantially refreshes rows with a large degree of damage while considering not only the number of accesses but also the health of the row, data damage to memory cells due to intensive access can be prevented, and row-hammer attacks can be more effectively defended.

Figure 10:
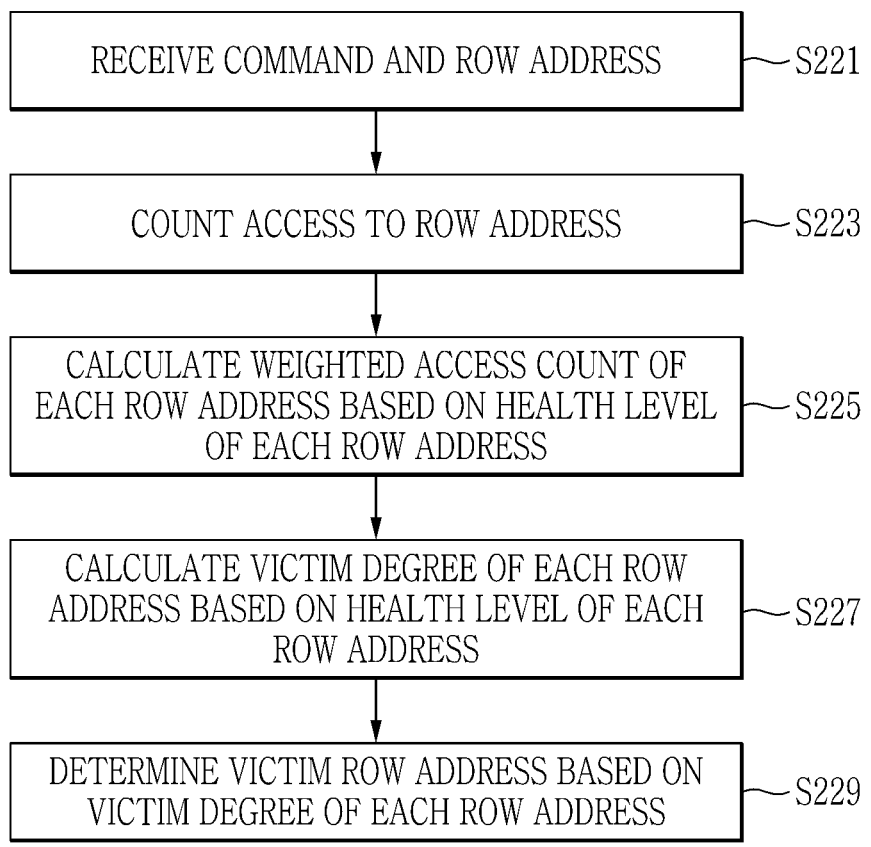
FIG. 10 is a flowchart showing steps in a method for determining a victim row address according to an example embodiment.

FIG. 10 is a flowchart showing steps in a method for determining a victim row address according to an example embodiment. FIG. 11 is a table showing access data and health data for determining the victim row address of FIG. 10. Referring to FIG. 10, in step S221, a control logic 220 (FIG. 2) may receive a command and row address RA from a memory controller 120.

The control logic 220 may count the number of accesses to a row address (S223). The control logic 220 may calculate a weighted access count of each row address based on a health level of each row addresses (S225). The weighted access count may be a value obtained by multiplying the number of accesses to an arbitrary row by a health level of the corresponding row.

Meanwhile, the method in which the control logic 220 calculates a victim degree based on the number of accesses according to FIG. 10 may not use the health data as is described with reference to FIG. 7. In some embodiments, the control logic 220 may allocate a health level of a weak row to rows adjacent to a row having a weak health level within the health data received from the ECC engine 280. When a row is attacked, the actually damaged row may be adjacent to the attacked row, and thus the number of times the row is damaged may be the sum of the accesses to two adjacent rows. The control logic 220 allocates a high health level to adjacent rows of the weak row to increase the number of accesses to the adjacent rows and thereby ultimately increasing the number of times of damage to the weak row.

Accordingly, the weak row can be refreshed. In an implementation, in the health data of FIG. 7, the third row R3 has the second health level and the eighth row R8 has the third health level. However, in FIG. 10, the control logic 220 may allocate a health level (second level) of a third row R3 to a second row R2 and a fourth row R4 adjacent to the third row R3, and may allocate a health level (third level) of an eighth row R8 to a seventh row R7 and a ninth row R9 adjacent to the eighth row R8. In addition, the control logic 220 may allocate a health level of a first level representing a non-weak row to the third row R3 and the eighth row R8, which may be weak rows. The control logic 220 may allocate a second level and a third level health level to the third row R3 and the eighth row R8, which may be weak rows, respectively.

Referring to FIG. 11, since an access count of the second row R2 is 2000 and the second row R2 has the second health level, a weighted access count of the second row R2 may be 4000, which is 2000*2. In addition, since the third row R3 is a weak row but has a health level of the first level, the weighted access count of the third row R3 may be 3000. Since the access count of the fourth row R4 is 2000 and the fourth row R4 has a health level of the second level, the weighted access count of the fourth row R4 may be 4000, which is 2000*2. Similarly, the weighted access count of the seventh row R7 may be 3000, which is 1000*3, the eighth row R8 may have a weighted access count of 1000, and the ninth row R9 may have a weighted access count of 6000, which is 2000*3. In some embodiments, the control logic 220 reflects the health level of each row for every access within a predetermined time and weights the number of accesses of each row instead of the above method of multiplying the access count accumulated for a predetermined time by the health level such that a value of the final weighted access count may be calculated. In an implementation, the control logic 220 may increase the weighted access count of the row by 1 whenever a row whose health level is the first level (e.g., first row R1) is accessed, but whenever a row whose health level is a second level (e.g., second row R2) is accessed, the weighted access count of that row may be increased by 2, and whenever a row with a health level of a third level (e.g., seventh row R7) is accessed, the weighted access count of that row may be increased by 3.

Next, the control logic 220 calculates a victim degree of each row address based on the number of weighted accesses (S227).

The victim degree may be a quantitative representation of damage suffered by the row. In some embodiments, the control logic 220 may calculate the victim degree for each row based on the weighted number of accesses of each row. In an implementation, the control logic 220 may calculate the victim degree of a corresponding row by adding the weighted access counts for each of two rows adjacent to a row in the access data.

In an implementation, as shown in FIG. 11, the victim degree of the third row R3 may be the sum of the weighted access count of the second row R2 (e.g., 4000) and the weighted access count of the fourth row R4 (e.g., 4000). The victim degree of the third row R3 may be 8000.

The victim degree of the eighth row R8 may be the sum of the weighted access count of the seventh row R7 (e.g., 3000) and the weighted access count of the ninth row R9 (e.g., 6000). The victim degree of the eighth row R8 may be 9000. In a similar way, the control logic 220 may also calculate the victim degree of other rows. The control logic 220 may determine an additional refresh target row based on the victim degree (S229).

In some embodiments, the control logic 220 may determine the address of a row having a victim degree that exceeds a predetermined reference as a victim row address. In an implementation, when the predetermined reference is 7000, the control logic 220 may determine row addresses of the third row R3 and the eighth row R8, which may be rows of which victim degree exceeds 7000, as victim row addresses.

In some embodiments, the control logic 220 may determine the row address with the greatest victim degree as an additional refresh target row. In an implementation, the control logic 220 may determine the row address of the eighth row R8 as the victim row address.

In some embodiments, the control logic 220 may sequentially determine a predetermined number of row addresses as rows to be additionally refreshed, starting from row addresses having the greatest victim degree.

In some embodiments, the control logic 220 may communicate the determined victim row address to the refresh control circuit 290. The method for determining additional refresh target rows has been described with reference to FIG. 8 and FIG. 10. The method for determining which victim row address the memory device 110 uses may be set in advance. The memory device 110 may determine the victim row address according to a predetermined method. The memory device may use any method that can consider the number of accesses to each row and the physical strength of each row.

Since the control logic 220 according to an embodiment substantially refreshes rows having a large degree of damage while considering not only the number of accesses but also the health of the row, data damage to memory cells due to intensive access can be prevented, and row-hammer attacks can be more effectively defended. In addition, the control logic 220 according to an embodiment can calculate the victim degree based on the number of accesses to the row without calculating the number of accesses to the adjacent row adjacent to the row being accessed such that the victim degree for each row can be quickly calculated.

Figure 12:
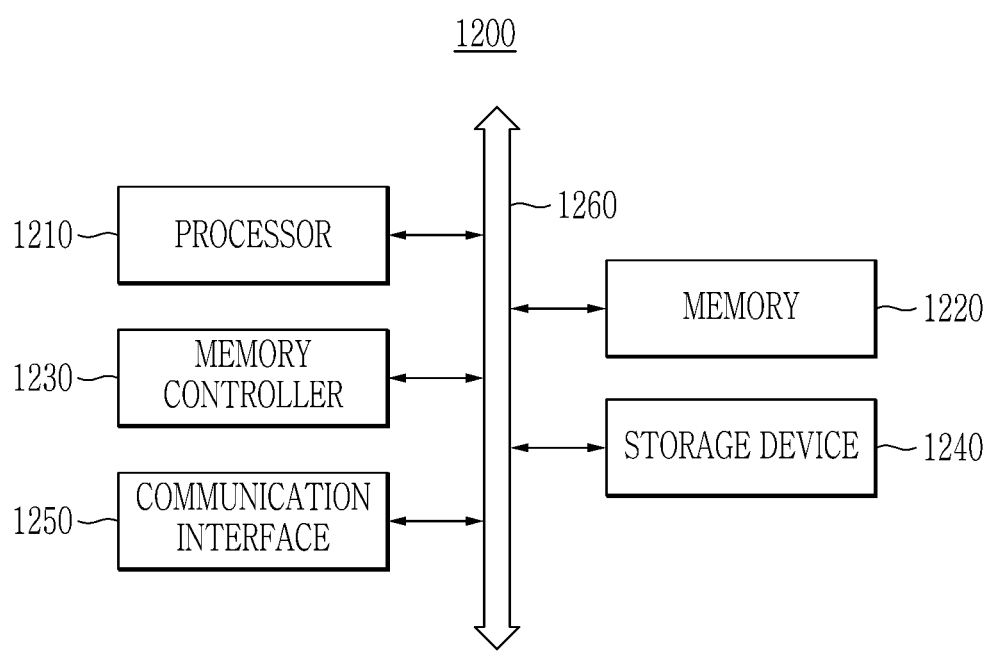
FIG. 12 is a block diagram showing a computing device according to an example embodiment.

FIG. 12 is a block diagram showing a computing device according to an example embodiment. Referring to FIG. 12, a computing device 1200 may include a processor 1210, a memory 1220, a memory controller 1230, a storage device 1240, a communication interface 1250, and a bus 1260. The computing device 1200 may further include other general-purpose constituent elements of another volume.

The processor 1210 may control the overall operation of each component of the computing device 1200. The processor 1210 may be implemented as at least one of various processing units such as a central processing unit (CPU), an application processor (AP), or a graphics processing unit (GPU).

The memory 1220 stores various data and commands. The memory 1220 may be implemented as the memory device described with reference to FIG. 1 to FIG. 11. The memory 1220 may include a plurality of rows and a memory cell array in which various data and commands are stored. The memory 1220 may read stored data and correct errors in the read data. The memory 1220 may determine a health level for each of a plurality of rows based on the number of error corrections. The memory controller 1230 controls the transmission of data or commands to and from the memory 1220.

The memory 1220 may determine a row that has suffered the most damage in the memory cell array as a victim row based on the number of times the memory controller 1230 accesses the memory 1220 and the health level. The memory 1220 may perform an operation of refreshing the victim row. In some embodiments, the memory controller 1230 may be provided as a separate chip from the processor 1210. In some embodiments, the memory controller 1230 may be provided as an internal component of the processor 1210.

The storage device 1240 non-temporarily stores programs and data. In some embodiments, the storage device 1240 may be implemented as a non-volatile memory. The communication interface 1250 supports wired and wireless Internet communication of the computing device 1200. In addition, the communication interface 1250 may support various communication methods other than Internet communication. The bus 1260 provides a communication function between constituent elements of the computing device 1200. The bus 1260 may include at least one type of bus according to a communication protocol between constituent elements.

By way of summation and review, as a space between rows in a memory device gradually narrows, when the access frequency of specific memory cells increases in a memory device such as a dynamic random access memory (DRAM), memory cells adjacent to the accessed memory cell are degraded, such that the effect on the charge in the accessed memory cell increases. Therefore, data reliability of the memory device may be lowered. Meanwhile, the degree of degradation of memory cells due to a difference in processes may be different for each memory cell.

An example embodiment may provide a memory device and an operation method of the memory device that may alleviate row-hammer phenomenon and attacks. An example embodiment may provide a memory device with improved data reliability and an operation method of the memory device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

In the detailed description, only certain embodiments of the present invention have been shown and described, simply by way of illustration. As those skilled in the art would realize, the described embodiments may be modified in various different ways, all without departing from the spirit or scope of the present invention.

Accordingly, the drawings and description are to be regarded as illustrative in nature and not restrictive. Like reference numerals designate like elements throughout the specification. In the flowchart described with reference to the drawing, the order of operations may be changed, several operations may be merged, a certain operation may be divided, and a specific operation may not be performed.

In addition, expressions written in the singular may be interpreted as singular or plural, unless explicit expressions such as "one" or "single" are used. Terms containing ordinal numbers, such as first and second, may be used to describe various configurations elements, but constituent elements are not limited by these terms. These terms may be used for the purpose of distinguishing one constituent element from another constituent element.

What is claimed is:

1. A memory device, comprising:
   a memory cell array including a plurality of rows;
   an ECC engine configured to determine a health level for each of the plurality of rows based on a number of corrections of errors of data read from each of the plurality of rows;
   a control logic configured to determine a victim row address based on the health level and a number of accesses for each of the plurality of rows; and
   a refresh control circuit configured to perform a refresh on a row corresponding to the determined victim row address,
   wherein the control logic is configured to calculate:
   a number of damage occurrences of a first row, which is the sum of a number of accesses to two rows adjacent to the first row among the plurality of rows, and
   a first victim degree of the first row by multiplying a health level for the first row and the number of damage occurrences of the first row, or
   wherein the control logic is configured to calculate:
   a weighted access count for each of the plurality of rows by multiplying the number of accesses for each of the plurality of rows by the health level for each of the plurality of rows, and
   a second victim degree of a first row by adding the weighted access count of two rows adjacent to the first row among the plurality of rows.

2. The memory device as claimed in claim 1, wherein the control logic includes:
   an access counter configured to count the number of accesses to a row address of each of the plurality of rows, and
   a register configured to store access data including the number of accesses to the row address and the row address.

3. The memory device as claimed in claim 1, wherein:
   the control logic includes an access counter configured to count the number of accesses to a row address of each of the plurality of rows, and
   the memory cell array includes memory cells configured to store access data including the row address and the number of accesses to the row address.

4. The memory device as claimed in claim 1, wherein the ECC engine includes:
   an ECC encoding circuit configured to generate parity bits related to write data written into the memory cell array and stores the write data and the parity bits in the memory cell array;
   an ECC decoding circuit configured to generate an error occurrence signal while correcting an error in read data read from the memory cell array by using the read data and the parity bits; and
   a health level generator configured to determine a number of error occurrences for each of the plurality of rows by counting the error occurrence signals, and determines the health level for each of the plurality of rows by comparing the number of error occurrences with a preset threshold.

5. The memory device as claimed in claim 4, wherein when a number of occurrences of a first error for the first row among the plurality of rows is greater than a number of occurrences of a second error for a second row among the plurality of rows, a health level of the first row is higher than a health level of the second row.

6. The memory device as claimed in claim 1, wherein the control logic is configured to determine a row address of the row having a greater victim degree than a predetermined reference among the plurality of rows as the victim row address.

7. The memory device as claimed in claim 1, wherein the control logic is configured to determine a row address of the row with the greatest victim degree as the victim row address.

8. A memory system, comprising:
a memory controller that provides a command and an address; and
a memory device, including a memory cell array including a plurality of rows, that determines a victim row address based on a value obtained by multiplying a number of accesses to each of the plurality of rows by the command and address and health levels of the plurality of rows, and performs a refresh on a row corresponding to the determined victim row address,
wherein the memory device is configured to:
calculate a number of damage occurrences of a first row, which is the sum of a number of accesses to two rows adjacent to the first row among the plurality of rows,
calculate a first victim degree of the first row by multiplying a health level for the first row and the number of damage occurrences of the first row, and
determine the victim row address based on the first victim degree, or
wherein the memory device is configured to:
calculate a weighted access count for each of the plurality of rows by multiplying the number of accesses for each of the plurality of rows by the health level for each of the plurality of rows,
calculate a second victim degree of a second row by adding the weighted access count of two rows adjacent to the second row among the plurality of rows, and
determine the victim row address based on the second victim degree.

9. The memory system as claimed in claim 8, wherein:
the memory device is configured to determine the health level for each of the plurality of rows based on a number of error corrections of data read from each of the plurality of rows, and
the memory device is configured to set the memory controller to not access the first row having the health level exceeding a predetermined level.

10. An operation method of a memory device, the operation method comprising:
generating health data including a health level of each of a plurality of rows included in a memory cell array based on a number of error corrections of data read from each of the plurality of rows;
determining a victim row address based on the health data and a number of accesses for each of the plurality of rows; and refreshing on a row corresponding to the determined victim row address,
wherein the determining of the victim row address includes:
calculating a number of damage occurrences for each of the plurality of rows;
calculating a first victim degree of each of the plurality of rows by multiplying the health level for each of the plurality of rows and the number of damage occurrences for each of the plurality of rows; and
determining the victim row address based on the first victim degree of each of the plurality of rows, or
wherein the determining of the victim row address includes:
calculating a weighted access count for each of the plurality of rows based on an access count for each of the plurality of rows and the health level for each of the plurality of rows;
calculating a second victim degree of each of the plurality of rows based on a weighted access count for each of the plurality of rows; and
determining the victim row address based on the second victim degree of each of the plurality of rows,
wherein the calculating of the second victim degree includes calculating a victim degree of a first row among the plurality of rows by adding a weighted access count for two rows adjacent to the first row.

11. The operation method as claimed in claim 10, wherein the generating of the health data includes:
performing an ECC operation for generating an error generation signal while correcting an error in read data read from each of the plurality of rows based on the read data and parity data;
generating error data including a row address of a row in which the error is corrected and the number of error corrections for the row address; and
determining the health level for each row address of the plurality of rows by comparing the error data with a predetermined threshold value.

12. The operation method as claimed in claim 10, wherein the calculating of the number of damage occurrences includes:
calculating a number of times of damage occurrences of a second row by adding a number of accesses to two rows adjacent to the second row among the plurality of rows.

13. The operation method as claimed in claim 10, wherein the determining of the victim row address based on the second victim degree of each of the plurality of rows includes:
determining a row address of the row having the greatest victim degree based on the second victim degree of each of the plurality of rows as the victim row address.

* * * * *